United States Patent [19]
Liaw et al.

[11] Patent Number: 5,480,837
[45] Date of Patent: Jan. 2, 1996

[54] PROCESS OF MAKING AN INTEGRATED CIRCUIT HAVING A PLANAR CONDUCTIVE LAYER

[75] Inventors: Ing-Ruey Liaw, Hsinchu; Shun-Ho Lin, Ping Tung, both of Taiwan

[73] Assignee: Industrial Technology Research Institute, Hsinchu, Taiwan

[21] Appl. No.: 266,499

[22] Filed: Jun. 27, 1994

[51] Int. Cl.$^6$ .......................... H01L 21/44; H01L 21/48
[52] U.S. Cl. ............................................. 437/193; 437/200
[58] Field of Search .................................... 437/193, 233, 437/200, 41, 41 GS; 148/DIG. 19

[56] References Cited

U.S. PATENT DOCUMENTS

| | | | |
|---|---|---|---|
| 4,755,478 | 7/1988 | Abernathey et al. | 437/41 |
| 4,829,024 | 5/1989 | Klein et al. | 437/189 |
| 5,010,029 | 4/1991 | Liu et al. | 437/44 |
| 5,100,826 | 3/1992 | Dennison | 437/52 |
| 5,200,358 | 4/1993 | Bollinger et al. | 437/180 |
| 5,262,343 | 11/1993 | Rhodes et al. | 437/233 |

*Primary Examiner*—George Fourson
*Assistant Examiner*—C. Everhart
*Attorney, Agent, or Firm*—George O. Saile

[57] ABSTRACT

An improved process for fabricating an integrated circuit is achieved by forming a planar conductive layer over closely spaced structures, such as gate electrode structures of field effect transistors (FET) and the electrically interconnecting word line structures of DRAM and SRAM chips. The planar conductive layer is then patterned by plasma etching to form the next level of electrical interconnecting bit lines, which makes contact to the source/drain of the FETs. The process involves the conformal deposition of a relatively thick polysilicon layer to fill the submicrometer spaces in the underlying structure. An etch back of the polysilicon and the deposition of a metal silicide is used to form an essentially planar conducting layer. This locally planar layer over submicrometer spaced features, with high aspect ratios, provides an ideal surface for exposing and developing distortion free and residue free submicrometer photoresist images required for Ultra Large Semiconductor Integration (ULSI).

14 Claims, 5 Drawing Sheets

PROCESS OF MAKING AN INTEGRATED CIRCUIT HAVING A PLANAR CONDUCTIVE LAYER

BACKGROUND OF THE INVENTION (1) Field of the Invention

The present invention relates to the formation of integrated circuits on semiconductor substrates, and more particularly a method for forming a patterned planar conductive layer.

(2) Description of the Prior Art

Today's Ultra Large Scale Integration (ULSI) on the semiconductor substrate is in part due to advances in high resolution photolithographic techniques and to advances in plasma etching of the various conducting and insulating layers on the substrate. However, the accumulated effect of depositing and the etching of patterns in these layers, one patterned layer on top of the other, has resulted in irregular or substantially non-planar surface with micrometer and submicrometer feature sizes on a otherwise microscopically planar substrate.

These irregular surface features cause a number of process and reliability problems. For example, incomplete exposure of photoresist and thickness variations of the photoresist due to the leveling effect over recesses in the underlying patterned layer, result in incomplete development of the photoresist image. This results in unwanted photoresist residue which acts to mask the underlying layer during etching to define the patterned layer. This results in shorts when patterning conducting layers, such as polysilicon, or can lead to open contacts when etching via contacts in insulating layers. This problem is especially troublesome on ULSI circuits where the feature dimensions are submicrometer in size.

One particular area in ULSI semiconductor processing where this type of nonplanar structures occur is the formation of the electrical interconnecting patterns used to contact source/drains on Field Effect Transistors (FETs). For example, this is particularly the case for forming the bit line wiring used on dynamic random access memory (DRAM) and static random access memory (SRAM) chips. Generally this wiring makes contact to the source/drain of the FET and is patterned from a doped polysilicon or polysilicon/silicide layer that is formed over the FET gate electrode or the interconnecting patterned layer, that is also usually formed from polysilicon or polysilicon/silicide layer.

Because of the high density of memory cells on the chip, adjacent FET are closely spaced and their gate electrodes have horizontal dimensions that are submicrometer in width, for example about 0.5 micrometers or less. On the other hand the gate electrode, composed of the doped polysilicon layer and the insulating layer formed thereon, can be about 0.5 micrometers or more in height. The spaces between the gate electrodes are also submicrometer in width, for example about 0.5 micrometers or less in width, and have source/drain areas to which the bit lines must make electrical contact. Therefore, the bit line, composed of a patterned polysilicon or polysilicon/silicide layer, must pass over the patterned first polysilicon layer forming the gate electrode and interconnecting word line. Therefore, the bit lines wiring is required to traverse a surface having recesses or spaces that have aspect ratios that are quite large, for example equal to or greater than one.

This rough surface topography makes it difficult to define the photoresist pattern without image distortion. Furthermore, residue remaining after the photoresist image is formed over this rough topography can act as an etch stop when the underlying polysilicon layer is etched.

One approach of eliminating this problem is to form a planarized insulating layer over the patterned polysilicon layer that comprises the FET gate electrode and interconnecting word lines. The self-aligned source/drain contact openings are then etched in this planar insulating layer to provide the bit line electrical contact. Several methods have been used to planarize this layer, for example, a planarizing photoresist or spin-on-glass etch back can be used. Another approach is to use a low flow temperature glass, such as phosphosilicate glass (PSG) and borophosphosilicate glass (BPSG) or by using a biased plasma enhanced CVD (PECVD), and similar techniques.

In order to preserve the high device density for ULSI applications, such as on DRAM and SRAM chips, the contacts openings to the FET source/drains must be self-aligned. That is, the contact openings are made in the insulating layer and are made overlapping the gate electrodes of the FETs. The silicon oxide or nitride sidewalls and the insulating layer over the gate electrode is then used as the defining layer for the source/drain contact. If the insulating is made planar, however, it is difficult to control the etching of the openings in the thick insulator without over etch. Even if silicon nitride is used as an etch stop over the electrode, the etch rate selectivity of the oxide to the nitride is at best about 2 to 1. This then results in electrical shorts between the patterned second polysilicon layer forming the bit line, and the polysilicon gate electrode.

A method for achieving a planar insulating layer and minimizing the overetch problem has been described by C. A. Bollinger et al, U.S. Pat. No. 5,200,358. In this patent, a doped insulator is deposited such as BPSG forming a conformal layer and filling the narrow spaces between the gate electrodes. The layer is then etched back to provide a local planarizing effect. The overlapping contact opening is then etched in the BPSG glass which etches faster than the silicon oxide or silicon nitride, improving the etch selectivity.

Although there are a number of methods available for forming a planar insulating layer and etching overlapping contact opening, there still remains the need to further improve the photoresist image quality and to form overlapping contacts that can avoid etching through a thick insulating layer.

SUMMARY OF THE INVENTION

It is the principle object of this invention to provide a planar conductive layer formed from a polysilicon/silicide layer to improve the thickness uniformity of the photoresist layer and to improve the photoresist optical exposure so as to provide a distortion free photoresist image.

It is another object of this invention to provide a planar conductive layer such that a photoresist imaging can be formed free of photoresist residue in the deep submicrometer wide recesses in the underlying patterned layer on the substrate.

It is still another object of the invention to avoid etching the source/drain contact openings in a thick silicon dioxide layer.

In accordance with these objectives the invention provides a new method for forming a planar conductive layer over a substrate having semiconductor devices built in and on the surface. The planar conductive layer provides a surface for forming a distortion free photoresist masking pattern, that is also free of photoresist residue. The photoresist mask and anisotropic plasma etching is then used to pattern this second planar polysilicon/silicide layer to form the interconnecting conductive layer. One particular application, is its use to form the interconnection metallurgy for the bit line contacts over a patterned first polysilicon/silicide layer used to form the gate electrodes and the word line interconnections on a DRAM or SRAM chip.

The method begins by providing a semiconductor substrate, such as single crystal silicon, having device areas formed therein and isolated from each other by a relatively thick field oxide. The FETs are then formed in the device areas over a thin gate oxide by patterning an appropriately doped first polysilicon or polysilicon and silicide layer. This first polysilicon layer usually has an insulating layer formed on the surface and on its sidewalls. A second insulating layer is then deposited over this patterned first polysilicon layer and contact openings are formed in the insulating layer to the source/drain areas of the FETs. The second insulating layer is relatively thin and nonplanar, and the opening are etched without having to significantly over etch the underlying gate electrode insulator or sidewall spacer.

The contacts are made self-aligning by etching the contact openings larger in size than the source/drain area and overlapping the gate electrode and the field oxide. The sidewall spacers and field oxide provide for the self-aligning of the contact to the gate electrode.

A second polysilicon layer is deposited over the substrate making contact to the required source/drain areas through the contact openings in the second insulating layer. The polysilicon layer is then doped with N-type impurities, such as phosphorus to form an ohmic contact to the source/drain areas.

An undoped conformal third polysilicon layer is deposited to coat and fill the recesses between the gate electrodes. The undoped polysilicon is then etched back to the doped polysilicon layer to form an essentially planar polysilicon surface over and between the gate electrodes. A silicide, such as tungsten silicide (WSi) is deposited over the exposed doped polysilicon and portions of the undoped polysilicon to improve the conductivity and complete the planar conductive layer. The planar polysilicon and silicide layers are now patterned using conventional photolithography and anisotropic etching to complete the interconnecting conductive patterned for the bit line wiring.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

Now in keeping with the objects of the invention, the method for forming the planar conductive layer is covered in detail. This planar conductive layer can be fabricated on FET structures that are currently used in the manufacture of DRAMs and SRAM circuits. Therefore, only those details of the underlying structure will be described that are necessary for understanding the current invention.

Although the invention is described in detail for a FET structure, it should be well understood that the planar conductive layer and its patterning can be formed on other structures having closely spaced conducting patterned layers formed there under, such as on bipolar circuits and the likes.

Figure 1:
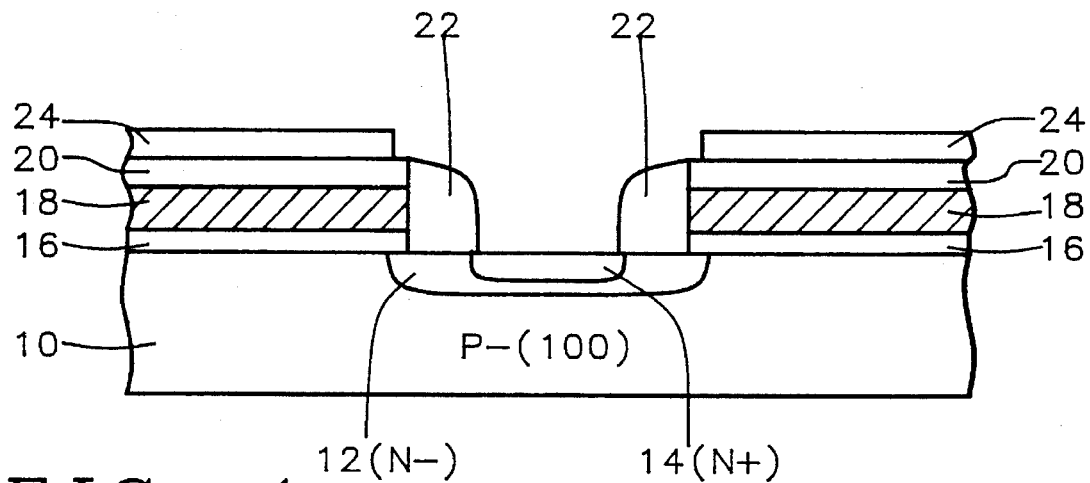
FIGS. 1 through 5 schematically illustrates in cross sectional representation of the preferred embodiment of the invention at different processing steps. A portion of two adjacent gate electrodes having a common source/drain and contact are shown.

Referring now to FIG. 1, a schematic cross-sectional view of the substrate 10 is shown, with portions of two adjacent and closely spaced FET transistors built on its surface and sharing a common bit line contact to the source/drain of the FETs. The second source/drain of each FET is not shown in order to simplify the description, but may contact a portion of a memory cell, such as the storage capacitor on a DRAM or the static latch portion of the circuit on a SRAM. The preferred substrate is composed of a P type single crystal silicon with a <100> crystallographic orientation, alternatively, an N-type substrate also be used. A thick Field OXide (FOX), also not shown in FIGS. 1 through 5 is first formed to isolate the device area, surrounding the region where the field effect devices, as shown in FIG. 1 are to be built. The details of forming the planar conductive layer, of this invention, over regions having a field oxide are discussed later in reference to FIGS. 6 through 11.

Briefly, the method commonly practiced in the industry for forming the Field OXide (FOX) consist of using a thin thermal oxide (pad oxide) and a silicon nitride layer as an oxidation resistant mask. The desired field oxide regions are etched open in the oxide/nitride layer using conventional photolithographic techniques and a field oxide is thermally grown, typically to a thickness of about 4500 to 5500 angstroms.

The semiconductor devices are then fabricated on the silicon surface in the non-oxidize areas, after removing the silicon nitride layer using a wet etch. For example,using a solution of heated phosphoric acid ($H_3PO_4$). For the DRAM and SRAM cell, the typical transistor used is a field effect transistor (FET) and is now briefly described. The silicon surface is first carefully cleaned and a good quality thermal oxide is grown to form the gate oxide 16, as shown in FIG. 1. The preferred thickness is between about 80 to 200 Angstroms.

Next, the gate electrode structure is formed by depositing a first polysilicon layer 18, for example, using a low pressure chemical vapor deposition (LPCVD) process. The preferred thickness is usually in the range from 2000 to 3000 Angstroms. Although the layer 18 is shown in FIG. 1 as a single layer, it is common practice in the semiconductor industry to provide on the polysilicon layer a silicide, such as tungsten silicide ($WSi_2$) to enhance the conductivity. The $WSi_2$ thickness is typically about 1000 to 1500 Angstroms.

After the gate polysilicon is appropriate doped and silicide is formed, a first insulating layer 20 composed of silicon oxide is then deposited on the polysilicon layer 18. The preferred thickness of insulating layer 20 is between about 1500 to 2000 Angstroms and more specifically having a thickness of 2000 Angstroms. The gate electrode structure is then formed by anisotropic etching in a low pressure plasma etcher using an appropriate gas mixture for each of the layers. Conventional photolithographic technique are used for defining the etch mask.

The next step is to form the lightly doped source/drain 12, of the N-channel FET. This doping is usually accomplished by implanting an N-type species, such as arsenic or phosphorous. For example, a typical implantation might consist of a phosphorous $p^{31}$ at a dose of between 1 to 10 E 13 atoms/cm$^2$ and with an energy of 30 to 80 Kev. As is well understood by one skilled in the art, a photoresist masking can be used to avoid implanting in areas not requiring the implant. Likewise, N doped well may be formed in the P substrate and P-channel FETs built and CMOS circuits formed therefrom.

After forming the lightly doped source/drain, side wall spacers 22 are next formed on the gate electrode structure. These spacers are formed by depositing a blanket layer of low temperature silicon oxide on the substrate and using an anisotropic etch to etch back to the source/drain surface leaving portions of the silicon oxide on the gate electrode sidewall. For example, the silicon oxide can be a chemical vapor deposition using tetraethoxysilane (TEOS) at a temperature in the range of about 650° to 900° C., and the etch back can be accomplished with a reactive plasma etcher of various design and using an appropriate gases mixture. For example, the etching can be performed in a gas mixture of carbon tetrafluoride and hydrogen ($CF_4/H_2$).

The source/drain contacts 14 are then formed by implantation. This doping is usually accomplished by implanting an N-type species, such as arsenic or phosphorous. For example, a typical implantation might consist of a phosphorous $p^{31}$ at a dose of between about 2.0 E 15 to 1.0 E 16 atoms/cm$^2$ and with an ion implant energy of between about 20 to 70 Kev.

The remainder of this embodiment relates more particularly to the objects of this invention which describes in detail the formation of the planar conductive layer composed of second polysilicon/silicide layer and patterning of said layer.

still referring to FIG. 1, a passivation or second insulating layer 24 is now deposited forming a conformal layer over the patterned first polysilicon/silicide layer 18 and over and in the recess between the gate electrodes. This provides the electrically passivating layer over portions of the substrate where contact to the exposed substrate is not required. The layer 24 is preferably composed of TEOS silicon oxide, as previously described for the sidewall spacer oxide deposition. The preferred thickness of layer 24 is between about 1000 to 1500 Angstroms and more specifically having a thickness of 1000 Angstroms.

The Self-Aligned Contact (SAC) openings are now formed through the insulating layer 24 to the required source/drain regions 14. Conventional lithography and plasma etching techniques are used to form this pattern of openings which are larger than the spacing between the gate electrodes of the FETs. This provides the contacts openings to the source/drain area 14 which are self-aligned to the sidewall spacer 22. Because the insulating layer 24 is not planarized and is relatively thin, the contact can be etched open without significant over etching and causing shorts.

Figure 2:
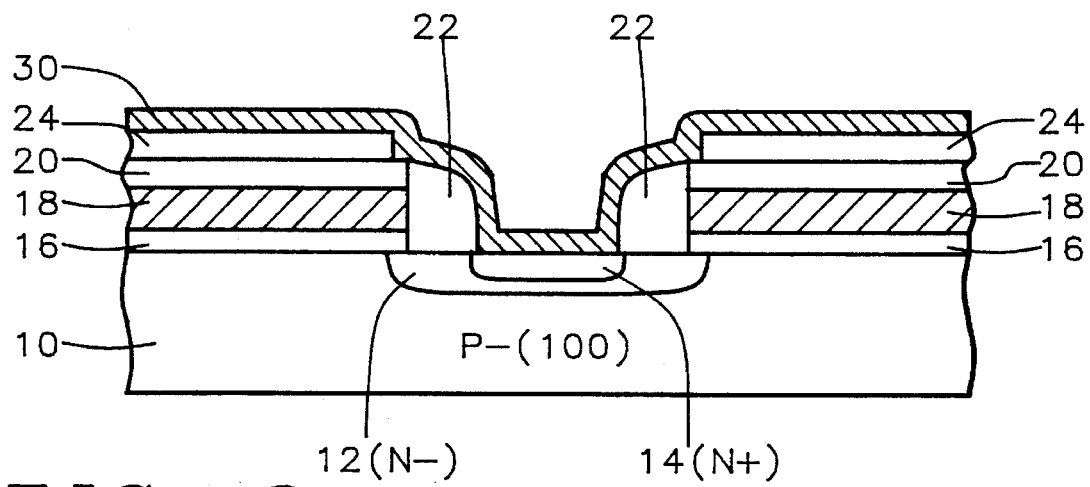

The planar conductive layer is formed next by the following sequence of deposition steps. Now as shown in FIG. 2, a second polysilicon layer 30 is deposited having a thickness of between about 500 to 1000 Angstroms, and more specifically having a thickness of 500 Angstroms. The preferred deposition is a low pressure chemical vapor deposition (LPCVD) as is commonly used in semiconductor industry for depositing conformal layers. The layer 30 is then implanted with a dopant species, such as arsenic or phosphorus, and at an ion dose of between about 3.0 E 15 to 7.0 E 15 atoms/cm$^2$ and at an ion implantation energy of about between 30 to 50 KeV. Alternatively, the layer 30 can be in situ doped during deposition. This layer 30 provides the ohmic contact to the source/drain area.

Figure 3:
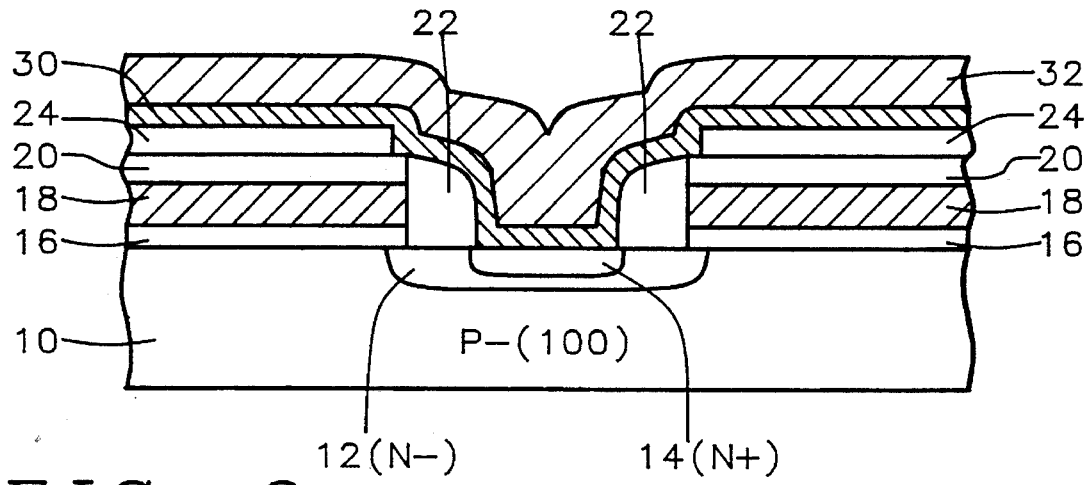

Now as shown in FIG. 3, a considerably thicker undoped third polysilicon layer 32, which is conformal in nature, is blanket deposited over layer 30. The thickness of this layer is critical and should be greater than at least one half the width of the recess between the gate electrodes of the FETs so as to adequately fill the recess. For example, on DRAM and SRAM chips the spacing between adjacent electrodes can be between about 4000 to 7000 Angstroms and the preferred thickness of the third polysilicon layer 32 is in the range of between about 2000 to 3000 Angstroms. The deposition of this layer is an important step in the invention because it fills the narrow recess between the gate electrodes providing a planarizing effect in the local areas having closely spaced gate electrodes. However, elsewhere on the substrate, where the spacing in the patterned first polysilicon layer 18 is large and therefore, does not cause a photoresist imaging or residue concern the polysilicon layer 32 remains conformal and the surface remains nonplanar.

Figure 4:
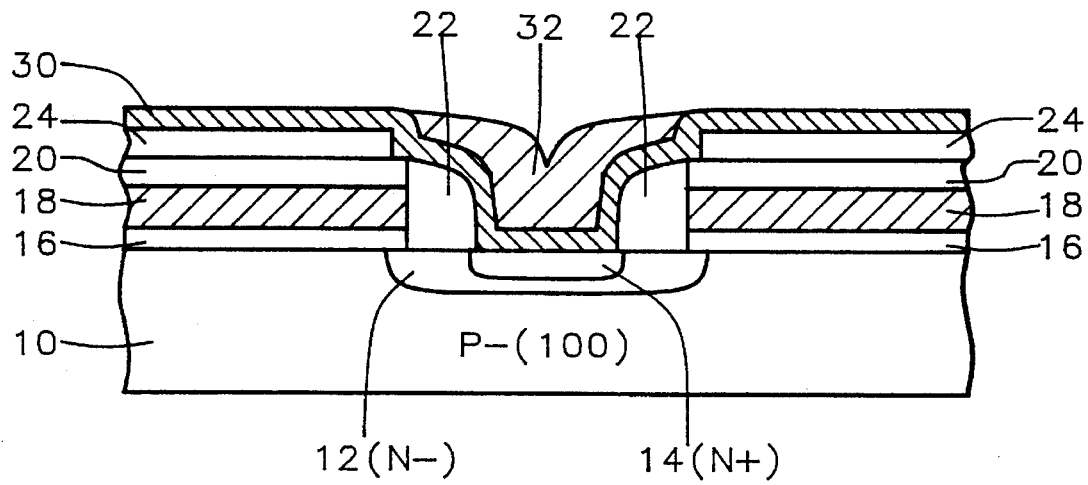
Figure 5:
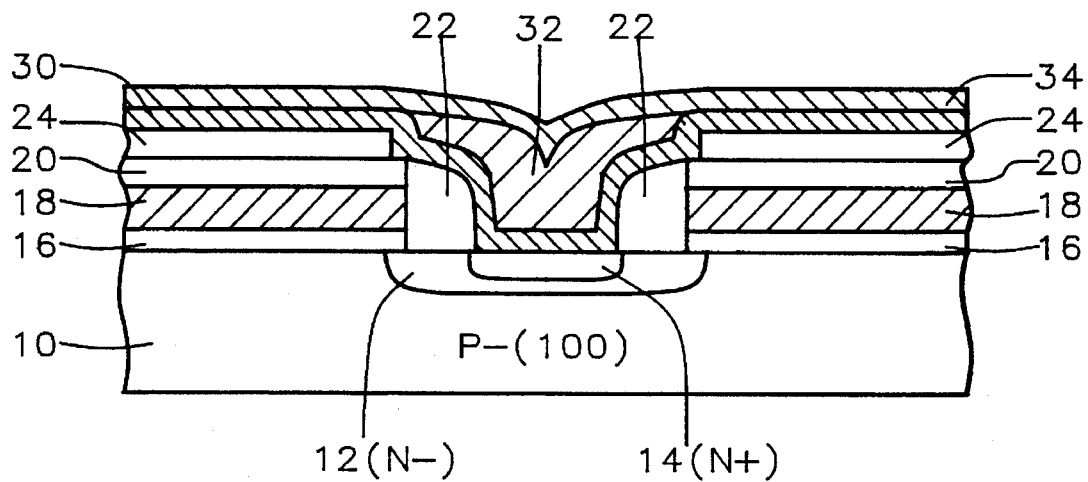

Referring now to FIG. 4, the third polysilicon layer 32 is blanket etched backed to the surface of the doped polysilicon layer 30, thereby forming an essentially planar surface with undoped portions of layer 32 filling the recesses between the gate electrodes. The etch back of layer 32 is performed in a reactive plasma etcher using a timed etch back and leaving a portion of layer 32 remaining on the substrate.

A tungsten silicide ($WSi_2$) layer 34 is now deposited on the doped polysilicon layer 30 over the gate electrode areas and over the undoped polysilicon portions of layer 32 in the recesses between the gate electrodes of the FETs. The silicide increases the electrical conductivity of the layer and improves circuit performance. The silicide layer 34 having a preferred thickness of between about 1000 to 1500 Angstroms and more specifically a thickness of about 1000 Angstroms. The preferred deposition is by chemical vapor deposition (CVD) using, for example, a gas mixture of tungsten hexafluoride ($WF_6$) and silane ($SiH_4$) in a reactor such as the Genus 8720 system manufactured Genus Corp. of Calif., USA.

The second interconnect level is now patterned using conventional photolithographic techniques and anisotropic etching to define and complete the second level of electrical interconnections, for example forming the bit line wiring on DRAM and SRAM chips. It should be noted, that the planar conductive layer, of this invention, over the narrow recesses eliminates the problems associated with optical exposure and development of the photoresist over the submicrometer wide surface features. The tungsten silicide layer 34 being planar is easily etched without requiring excessive over etching. For example, the over etching is reduced from about 120% to only 50% of the etch time. Because the undoped polysilicon layer 32 and the doped polysilicon layer 30 in the recesses, are substantially different in composition from the underlying second insulating layer 24, they can be significantly over etched without removing a significant portion of the underlying insulator that protects the gate electrodes. This being a result of the high etch rate selective of polysilicon to silicon oxide. For example, an etch selectivity exceeding 20 to 1 can be easily achieved using a chlorine gas mixture.

The formation of a planar conductive layer having a high selectivity etch rate to oxide (about 20:1) is significantly better than forming a planar silicon oxide and then etching self-aligning contact openings in the thick planar silicon oxide layer over a gate electrode having a insulating layer also composed of silicon oxide or silicon nitride. For example, the etch selectivity of silicon oxide to silicon nitride being at best only about 2 to 1.

Figure 6:
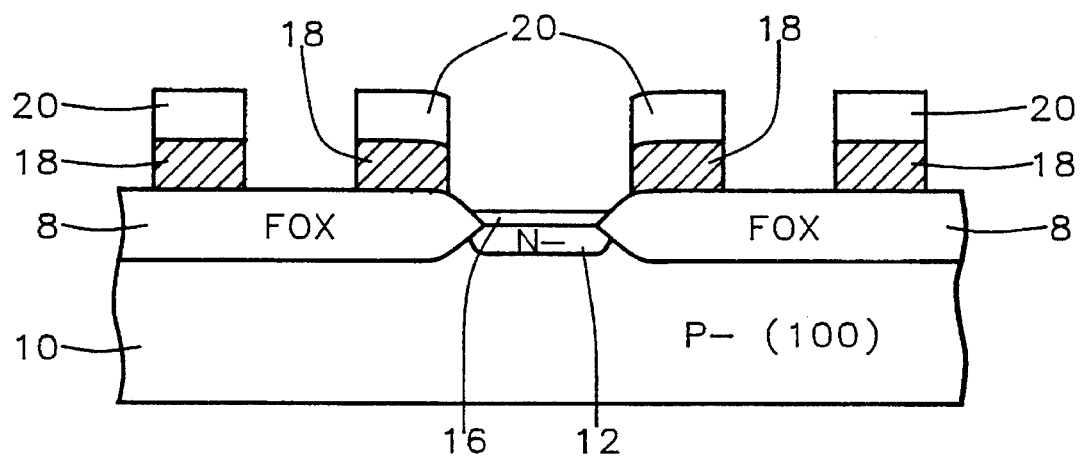
FIGS. 6 through 11 schematically illustrates in cross section representation the same preferred embodiment as in FIGS. 1 through 5, but with the cross section through a different portion of the substrate. The schematics show the same process steps for forming the planar conductive layer over closely spaced word lines formed from the same first polysilicon layer that is used to form the gate electrode over the device areas.

Referring now more particularly to FIGS. 6 through 11, there is shown the same embodiment as in FIGS. 1 through 5 of the invention, but for the formation of the planar conductive layer over the field oxide regions on the substrate. The word line structures over the field oxide are formed at the same time (concurrently) and from the same first polysilicon layer 18 as is used for the gate electrodes. Therefore, we use the same numbers as in FIGS. 1 through 5 to depict the same layers, and we also do not repeat the detailed description of the process.

referring now to FIG. 6, a portion of the substrate 10, is shown having formed on the surface a thick Field OXide (FOX) 8. Also formed thereon is a series of word lines patterned from the first polysilicon/silicide layer 18 and having the first insulating layer 20 thereon. The number 14 used to indicate the source/drain in FIGS. 1 to 5 is shown here as the N-doped region on the substrate which is, in this cross section, shown self-aligned to the field oxide. The gate oxide 16, is shown as previously described in FIG. 1 for forming the gate oxide of the FETs.

Figure 7:
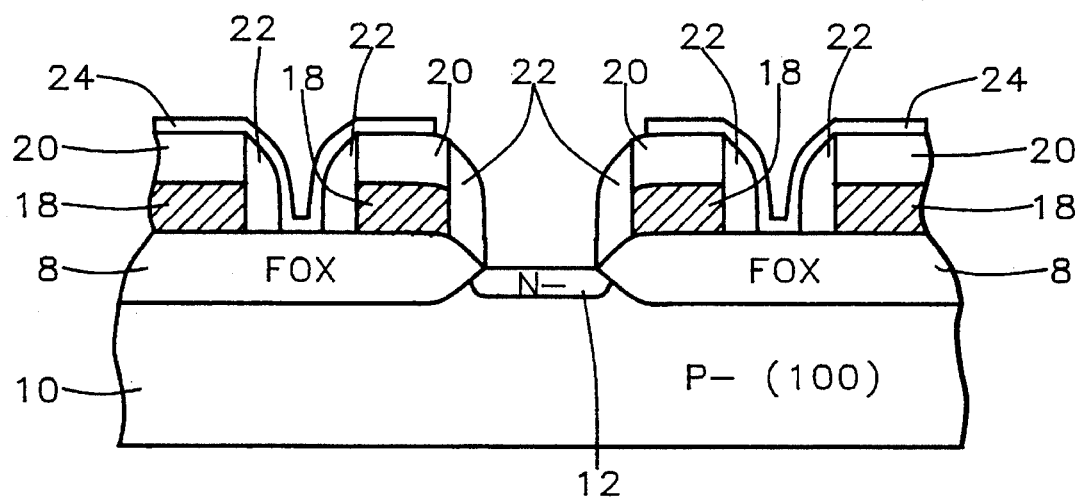

Now as shown in FIG. 7, the sidewall spacers 22 are formed, the source/drains regions are implanted and the passivation layer is formed by depositing the second insulating layer 22 as previously described. The contact shown in FIG. 7, for example, can be a portion of a source/drain area that is self-aligned to the field oxide 8 or can be contacts that are simultaneously made to other regions on the substrate for other circuit applications. Also shown in FIG. 7, is the self-aligned contact (SAC) opening formed in the insulating layer 24. The gate oxide is also removed at this time by the SAC etching.

Figure 8:
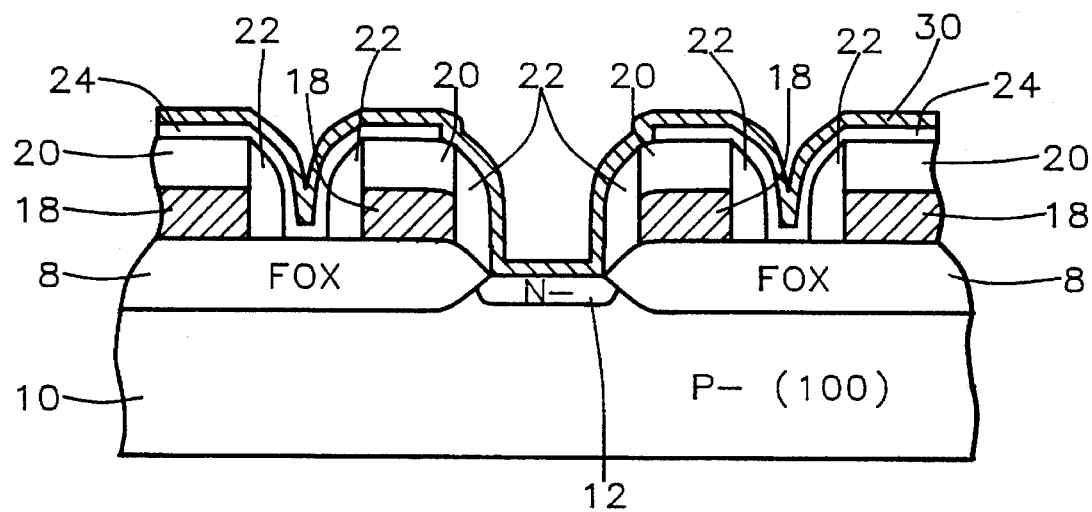
Figure 9:
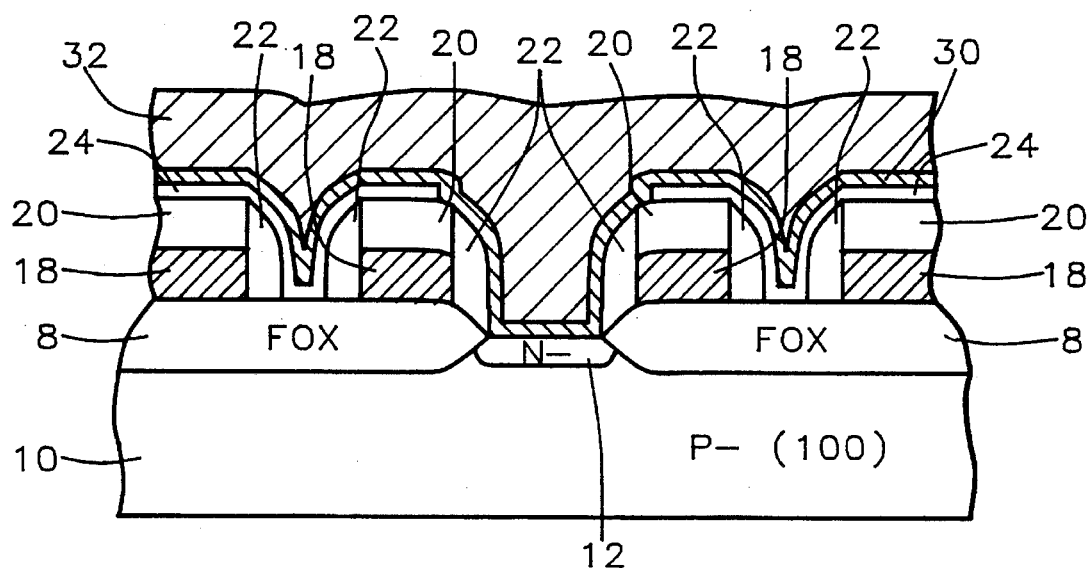
Figure 10:
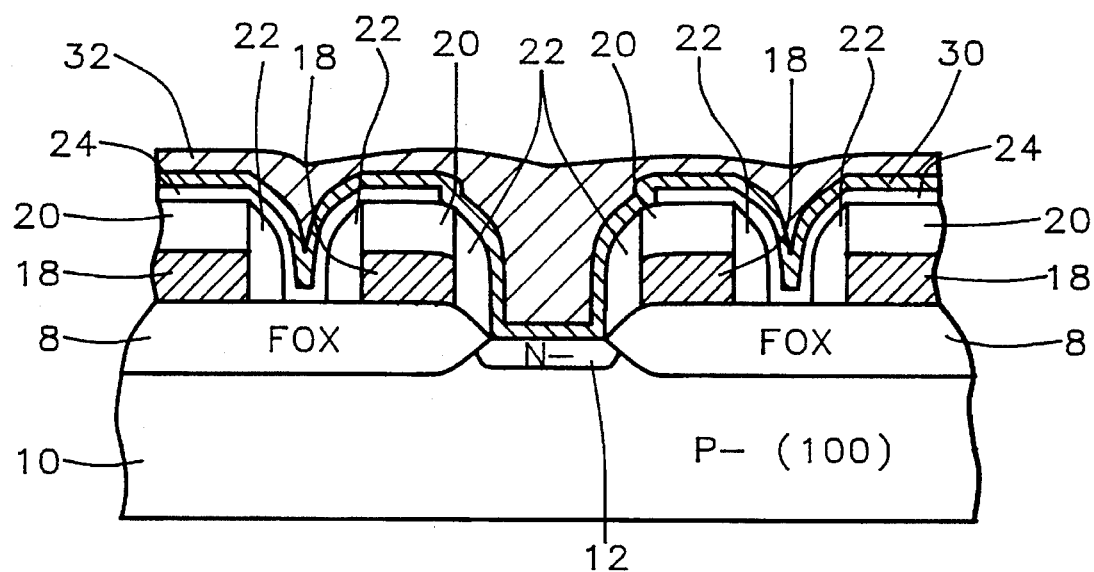
Figure 11:
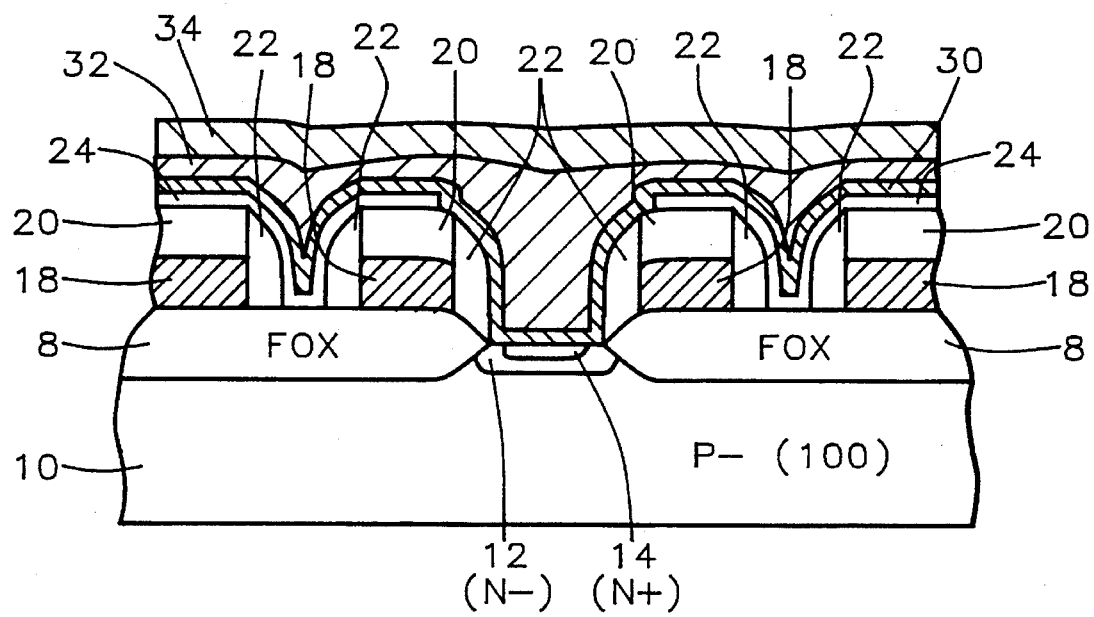

Next as shown in FIG. 8, the second polysilicon layer 30 is deposited and doped N-type and then as shown in FIG. 9, the thick undoped third polysilicon layer 32 is deposited being conformal, and of sufficient thickness to fill the recesses between the closely spaced word line formed from the first polysilicon layer 18. The third polysilicon layer 32 is then etched back to the doped polysilicon layer 30 as shown in FIG. 10 leaving portions of the undoped layer 32 in the recesses and forming an essentially planar surface. The tungsten silicide layer is formed next to improve the conductivity as shown in FIG. 11 and then conventional photolithography and anisotropic plasma etching is used to complete the second level interconnecting pattern in the planar conductive layer. The patterning by etching is not depicted in any of the Figs.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a planar electrically conductive interconnect layer on a substrate having device areas formed thereon, comprising the steps of:

providing a semiconductor substrate with a multitude of field effect transistors formed in and on said device areas with source/drain areas and having isolation field oxide areas formed elsewhere on said substrate;

providing a patterned first polysilicon layer, a portion forming gate electrodes for said field effect transistors and other portions of said first polysilicon layer forming interconnecting electrically conducting word lines elsewhere on said field oxide areas; and said patterned first polysilicon layer having a first insulating layer and insulating sidewall spacers thereon;

depositing a second insulating layer over said first insulating layer and said insulating sidewall spacers on said gate electrodes and elsewhere on said substrate;

forming opening in said second insulating layer over said source/drain areas thereby forming electrical contact openings;

depositing a second polysilicon layer over and in said contacts and elsewhere over said substrate and doping with impurities said second polysilicon layer, and thereby forming ohmic contacts to said source/drain areas;

depositing a conformal third polysilicon layer being sufficiently thick to thereby fill the spaces between said patterned first polysilicon layer;

etching back said third polysilicon layer to said second polysilicon layer leaving portions of said third polysilicon layer in spaces between said patterned first polysilicon layer, and thereby forming an essentially planar surface locally over and between said gate electrodes and over and between said patterned conducting layers elsewhere on said field oxide areas;

depositing a silicide layer over said second polysilicon layer and over portions of said third polysilicon layer forming a planar conductive layer, and thereby providing a surface for an optical exposure and development of a distortion free photoresist image; and patterning by masking and etching said silicide layer, and said second and third polysilicon layers to said second insulating layer forming and completing said patterned planar conductive layer electrically contacting said field effect transistor source/drain areas, and thereby forming interconnecting electrical conducting bit lines for said multitude of field effect transistors.

2. The method of claim 1, wherein said second insulating layer is a conformal layer of silicon oxide having a thickness of between about 1500 to 2000 Angstroms.

3. The method of claim 1, wherein the thickness of said second polysilicon layer is between about 800 to 1000 Angstroms.

4. The method of claim 3, wherein said second polysilicon layer is doped N-type with phosphorus or arsenic having a concentration of between about 3 E 15 to 7 E 15 atoms/cm$^3$.

5. The method of claim 1, wherein said third polysilicon is undoped and having a thickness which is at least greater than one half the width of the spaces between the patterned first polysilicon layer forming the gate electrodes.

6. The method of claim 5, wherein said width of said spaces are between about 0.4 to 0.7 micrometers and said third polysilicon layer has a thickness of at least greater than about 0.20 micrometers.

7. The method of claim 1, wherein said patterning by etching of said silicide, second and third polysilicon layer is performed in a reactive ion etcher having an etch rate selectivity of polysilicon to silicon oxide of at least 20 to 1.

8. A method for fabricating an integrated circuit having a planar conductive layer, comprising the steps of:

selectively forming relatively thick field oxide areas on the surface of a semiconductor substrate while leaving exposed device areas for fabricating field effect devices;

forming a gate oxide on said device areas of said substrate;

depositing a first polysilicon layer and then a first insulating layer on said device areas and on said field oxide areas;

patterning said first insulating layer and first polysilicon layer forming gate electrode structures on said device areas and forming portions on said field oxide areas, and thereby forming interconnecting electrically conducting word lines;

forming by implanting source/drain structures in said device areas and adjacent to said gate electrode structures and thereby forming field effect devices;

forming insulating sidewall spacers on said gate electrodes; and forming by implanting source/drain contacts to said source/drain structures;

depositing a second insulating layer over said first insulating layer and said insulating sidewall spacers on said gate electrodes and elsewhere on said substrate;

forming opening in said second insulating layer over said source/drain areas thereby forming electrical contact openings;

depositing a second polysilicon layer over and in said contacts and elsewhere over said substrate and doping with impurities said second polysilicon layer, and thereby forming ohmic contacts to said source/drain areas;

depositing a conformal third polysilicon layer being sufficiently thick to thereby fill the spaces between said patterned first polysilicon layer;

etching back said third polysilicon layer to said second polysilicon layer leaving portions of said third polysilicon layer in some spaces between said patterned first polysilicon layer, and thereby forming an essentially planar surface locally over and between said gate electrodes and over and between said patterned conducting layers elsewhere on said field oxide areas;

depositing a silicide layer over said second polysilicon layer and over portions of said third polysilicon layer forming a planar conductive layer, and thereby providing a surface for an optical exposure and development of a distortion free photoresist image; and patterning by masking and etching said silicide layer, and said second and third polysilicon layers to said second insulating layer forming and completing said patterned planar conductive layer electrically contacting said field effect devices source/drain areas, and thereby forming electrically conducting bit lines for said integrated circuits.

9. The method of claim 8, wherein said second insulating layer is a conformal layer of silicon oxide having a thickness of between about 1500 to 2000 Angstroms.

10. The method of claim 8, wherein the thickness of said second polysilicon layer is between about 500 to 1000 Angstroms.

11. The method of claim 10, wherein said second polysilicon layer is doped N-type with phosphorus or arsenic having a concentration of between about 3.0 E 15 to 7.0 E 15 atoms/cm$^3$.

12. The method of claim 8, wherein said third polysilicon is undoped and having a thickness which is at least greater than one half the width of the spaces between the patterned first polysilicon layer forming the gate electrodes.

13. The method of claim 12, wherein said width of said spaces are between about 0.4 to 0.7 micrometers and said third polysilicon layer has a thickness of at least greater than about 0.20 micrometers.

14. The method of claim 8, wherein said patterning by etching of said silicide, second and third polysilicon layer is performed in a reactive ion etcher having an etch rate selectivity of polysilicon to silicon oxide of at least 20 to 1.

* * * * *